(12) United States Patent
Glenn et al.

(10) Patent No.: US 6,396,043 B1
(45) Date of Patent: May 28, 2002

(54) THIN IMAGE SENSOR PACKAGE FABRICATION METHOD

(75) Inventors: Thomas P. Glenn, Gilbert; Steven Webster, Chandler, both of AZ (US); Roy Dale Hollaway, Paranaque Metro Manila (PH)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/448,538

(22) Filed: Nov. 22, 1999

(51) Int. Cl.⁷ ............................................. H01L 27/00
(52) U.S. Cl. ................. 250/208.1; 250/239; 250/214.1
(58) Field of Search ............................. 250/208.1, 239, 250/214.1; 257/290, 291, 431–434, 440, 80–84

(56) References Cited

U.S. PATENT DOCUMENTS

| | | | |
|---|---|---|---|
| 4,801,998 A | 1/1989 | Okuaki | 357/72 |
| 5,578,525 A | 11/1996 | Mizukoshi | 437/206 |
| 5,579,207 A | 11/1996 | Hayden et al. | 361/790 |
| 5,786,589 A | 7/1998 | Segawa et al. | 250/208.1 |
| 5,821,532 A | 10/1998 | Beaman et al. | 250/239 |
| 5,867,368 A | 2/1999 | Glenn | 361/783 |
| 5,962,810 A | 10/1999 | Glenn | 174/52.2 |
| 5,973,337 A | * 10/1999 | Knapp et al. | 257/99 |
| 6,144,507 A | 11/2000 | Hashimoto | 359/819 |

OTHER PUBLICATIONS

Corning Incorporated, Code: 1737F, Material Information Sheet, issued 1/96, 5 pages.
Corning Incorporated, Display Grade Products, Product Information, Sheet, revised 7/95, 4 pages.
Corning Incorporated, Score Cutting of 7059F and 1737F Sheet Glasses, Application Information Sheet, revised 4/96, 2 pages.
Lapp et al., New Substrate for Advanced Flat Panel Display Applications, Product Information Sheet, 1994, 4 pages. (Month Unknown).
Corning Incorporated, 1737 Sheet Glass, Products, Product Information Sheet, revised 3/97, 2 pages.
Corning Incorporated, Industrial Grade Products, Product Information Sheet, revised 3/97, 2 pages.

* cited by examiner

Primary Examiner—Que T. Le
(74) Attorney, Agent, or Firm—Gunnison, McKay & Hodgson, L.L.P.; Serge J. Hodgson

(57) ABSTRACT

A thin image sensor package includes an image sensor having an active area which is responsive to radiation. The image sensor is mounted to a substrate which is transparent to the radiation. The image sensor is mounted such that the active area of the image sensor faces the substrate. Of importance, the substrate serves a dual function. In particular, the substrate is the window which covers the active area of the image sensor. Further, the substrate is the platform upon which the image sensor package is fabricated. As a result, the image sensor package is thin, lightweight and inexpensive to manufacture.

16 Claims, 3 Drawing Sheets

THIN IMAGE SENSOR PACKAGE FABRICATION METHOD

FIELD OF THE INVENTION

The present invention relates generally to the packaging of electronic components. More particularly, the present invention relates to a method of fabricating and using an image sensor package.

BACKGROUND OF THE INVENTION

Image sensors and assemblies are well known to those of skill in the art. In these assemblies, an image sensor was located within a housing which supported a window. Radiation passed through the window and struck the image sensor which responded to the radiation.

Beaman et al., U.S. Pat. No. 5,821,532, which is herein incorporated by reference in its entirety, teaches an image sensor assembly. In the assembly, an image sensor was mounted to a printed circuit board. After the image sensor was mounted, a housing was mounted around the image sensor and to the print circuit board. This housing provided a hermetic like barrier around the image sensor, while at the same time, supported a window above the image sensor.

As the art moves to smaller and lighter weight electronic devices, it becomes increasingly important that the size of the image sensor assembly used within these electronic devices is small. Disadvantageously, conventional image sensor assemblies required a housing to support the window and to hermetically seal the image sensor. However, these housings are relatively bulky and extend upwards from the printed circuit board a significant distance, e.g., 0.100 inches (2.54 mm) to 0.120 inches (3.05 mm) or more.

In addition, mounting these housings at the printed circuit board level was inherently labor intensive and made repair or replacement of the image sensor difficult. In particular, removal of the housing exposed the image sensor to the ambient environment. Since the image sensor was sensitive to dust as well as other environmental factors, it was important to make repairs or replacement of the image sensor in a controlled environment such as a cleanroom. Otherwise, there was a risk of damaging or destroying the image sensor. Since neither of these alternatives are desirable and both are expensive, the art needs an image sensor assembly which is simple to manufacture and service so that costs associated with the image sensor assembly are minimized. Further, the image sensor assembly should be relatively thin.

SUMMARY OF THE INVENTION

In accordance with the present invention, an image sensor package includes an image sensor having an active area which is responsive to radiation. The image sensor is mounted to a substrate which is transparent to the radiation. The image sensor is mounted such that the active area of the image sensor faces the substrate.

During use, radiation is directed at the substrate. This radiation passes through the substrate and strikes the active area of the image sensor. The image sensor responds to the radiation in a conventional manner.

Of importance, the substrate serves a dual function. In particular, the substrate is the window which covers the active area of the image sensor. Further, the substrate is the platform upon which the image sensor package is fabricated.

Recall that in the prior art, a housing was used to support the window above the image sensor. These housings were typically formed of ceramic which is relatively expensive. Advantageously, an image sensor package in accordance with the present invention eliminates the need for a housing of the prior art. Accordingly, the image sensor package is significantly less expensive to manufacture than image sensor assemblies of the prior art.

In one embodiment, a bead is formed around a periphery of the image sensor such that the image sensor, the bead, and the substrate form a sealed cavity. The active area of the image sensor is located and hermetically sealed within this cavity. Hermetically sealing the active area reduces complexity and cost in the event the image sensor must be repaired or replaced compared to the prior art.

Recall that in the prior art, the housing which hermetically sealed the image sensor was mounted directly to the larger substrate. Thus, removal of the housing necessarily exposed the image sensor to the ambient environment and to dust. For this reason, the image sensor had to be repaired or replaced in a cleanroom or else there was a risk of damaging or destroying the image sensor.

In contrast, the active area is hermetically sealed as part of the image sensor package. The image sensor package is mounted to the larger substrate. To repair or replace the image sensor, the image sensor package is simply removed and a new image sensor package is mounted to the larger substrate. At no time is the active area exposed to the ambient environment during this procedure. Advantageously, this procedure can be performed in any facility with or without a cleanroom. The old image sensor package is discarded or shipped to a central facility for repair. Since the image sensor package is simple to manufacture and service, the cost associated with the image sensor package are minimized compared to the prior art.

Further, the image sensor package is relatively thin compared to prior art image sensor assemblies. In particular, by mounting the image sensor directly to the substrate which also serves as the window for the image sensor, the resulting thickness of the image sensor package is relatively small, e.g. is 0.99 millimeters (mm). Recall that in the prior art, the image sensor was mounted directly to the larger substrate and a housing was used to support a window above the image sensor. This housing extended a significant distance, e.g., 0.100 inches (2.54 mm) to 0.120 inches (3.05 mm) or more, from the larger substrate. Since the image sensor package in accordance with the present invention is relatively thin compared to an image sensor assembly of the prior art, the image sensor package is well suited for use with miniature lightweight electronic devices which require thin and lightweight image sensor assemblies.

In another embodiment, a step up ring is used to elevate interconnection balls above the image sensor, the interconnection balls being used to connect the image sensor package to a larger substrate such as a printed circuit mother board. Advantageously, use of the step up ring allows the interconnection balls to have minimum size and pitch. This may be important, for example, when a large number of interconnection balls must be provided in a limited area.

In one embodiment, a plurality of image sensor packages are fabricated simultaneously to minimize the cost associated with each individual image sensor package. In accordance with this embodiment, image sensors are attached to an array type substrate which includes a plurality of individual substrates integrally connected together. Beads are formed around the peripheries of the image sensors. The array type substrate is then singulated, either before or after the array type substrate is populated with interconnection balls or other interconnection structures.

By forming a plurality of image sensor packages simultaneously, several advantages are realized. One advantage is that it is less labor intensive to handle and process a plurality of image sensor packages simultaneously rather than to handle and process each image sensor package on an individual basis. By reducing labor, the cost associated with each package is minimized.

In one embodiment, an image sensor package includes an image sensor having a bond pad and an active area responsive to radiation. The image sensor package further includes a substrate transparent to the radiation and an electrically conductive trace formed on the substrate. The bond pad is electrically connected to the trace.

In another embodiment, a method of using an image sensor package includes forming a trace on a substrate, attaching a bond pad of an image sensor to the trace, and directing radiation at the substrate. The radiation passes through the substrate and strikes an active area of the image sensor.

In yet another embodiment, a method of forming an image sensor package includes forming a trace on a substrate. A bond pad of an image sensor is attached to the trace. A bead is formed around a periphery of the image sensor. The image sensor, the bead, and the substrate defined a cavity. An active area of the image sensor is located within the cavity.

These and other features and advantages of the present invention will be more readily apparent from the detailed description set forth below taken in conjunction with the accompanying drawings.

BRIEF DESCRIPTION OF THE DRAWINGS

In the following description, similar elements are labeled with similar reference numbers.

DETAILED DESCRIPTION

Figure 1:
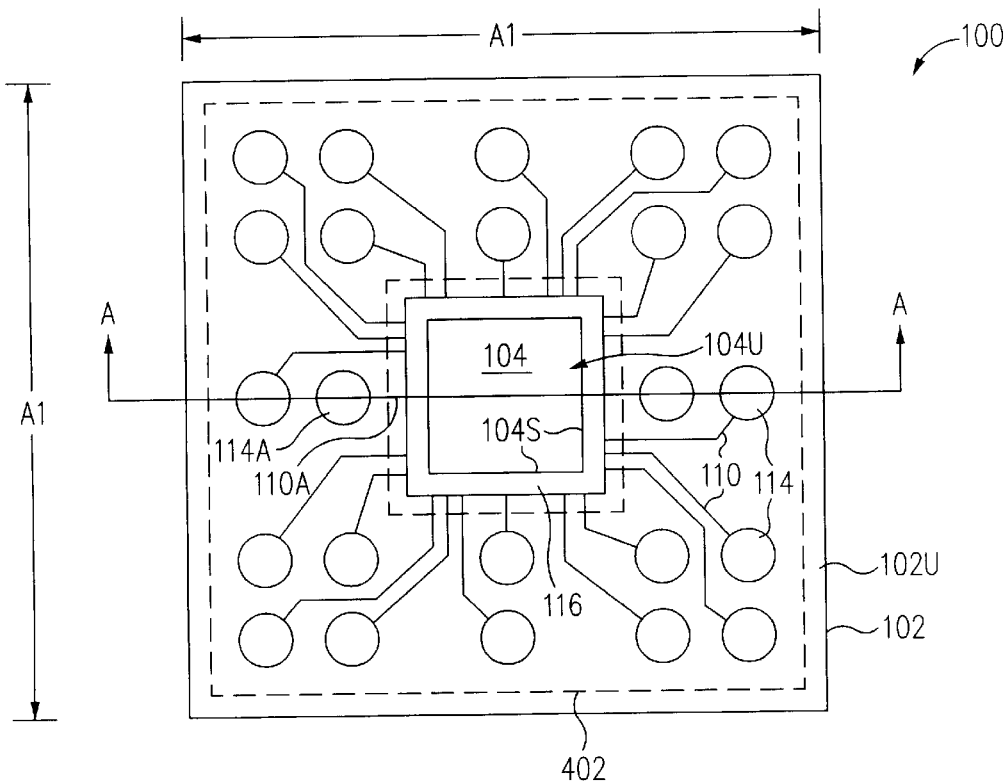
FIG. 1 is a top plan view of an image sensor package in accordance with the present invention.

In accordance with the present invention, an image sensor package 100 (FIGS. 1, 2) includes an image sensor 104 having an active area 106 which is responsive to radiation. Image sensor 104 is mounted to a substrate 102 which is transparent to the radiation. Image sensor 104 is mounted such that active area 106 of image sensor 104 faces substrate 102.

During use, radiation is directed at substrate 102. This radiation passes through substrate 102 and strikes active area 106 of image sensor 104. Image sensor 104 responds to the radiation as is well known to those of skill in the art.

Of importance, substrate 102 serves a dual function. In particular, substrate 102 is the window which covers active area 106 of image sensor 104. Further, substrate 102 is the platform upon which image sensor package 100 is fabricated.

Recall that in the prior art, a housing was used to support the window above the image sensor. These housings were typically formed of ceramic which is relatively expensive. Advantageously, image sensor package 100 in accordance with the present invention eliminates the need for a housing of the prior art. Accordingly, image sensor package 100 is significantly less expensive to manufacture than image sensor assemblies of the prior art.

In one embodiment, a bead 116 is formed around a periphery of image sensor 104 such that image sensor 104, bead 116, and substrate 102 form a sealed cavity 118. Active area 106 of image sensor 104 is located and hermetically sealed within cavity 118. Hermetically sealing active area 106 reduces complexity and cost in the event image sensor 104 must be repaired or replaced compared to the prior art.

Recall that in the prior art, the housing which hermetically sealed the image sensor was mounted directly to the larger substrate. Thus, removal of the housing necessarily exposed the image sensor to the ambient environment and to dust. For this reason, the image sensor had to be repaired or replaced in a cleanroom or else there was a risk of damaging or destroying the image sensor.

In contrast, active area 106 is hermetically sealed as part of image sensor package 100. Image sensor package 100 is mounted to the larger substrate, for example, by reflowing interconnection balls 114. To repair or replace image sensor 104, image sensor package 100 is simply removed and a new image sensor package 100 is mounted to the larger substrate. At no time is active area 106 exposed to the ambient environment during this procedure. Advantageously, this procedure can be performed in any facility with or without a cleanroom. The old image sensor package 100 is discarded or shipped to a central facility for repair. Since image sensor package 100 is simple to manufacture and service, the cost associated with image sensor package 100 are minimized compared to the prior art.

Further, image sensor package 100 is relatively thin compared to prior art image sensor assemblies. In particular, by mounting image sensor 104 directly to substrate 102 which also serves as the window for image sensor 104, the resulting thickness of image sensor package 100 is relatively small, e.g. is 0.99 millimeters (mm). Recall that in the prior art, the image sensor was mounted directly to the larger substrate and a housing was used to support a window above the image sensor. This housing extended a significant distance, e.g., 0.100 inches (2.54 mm) to 0.120 inches (3.05 mm) or more, from the larger substrate. Since image sensor package 100 in accordance with the present invention is relatively thin compared to an image sensor assembly of the prior art, image sensor package 100 is well suited for use with miniature lightweight electronic devices which require thin and lightweight image sensor assemblies.

In another embodiment, a step up ring 402 (FIG. 4) is used to elevate interconnection balls 114-1 above image sensor 104, interconnection balls 114-1 being used to connect image sensor package 400 to a larger substrate such as a printed circuit mother board. Advantageously, use of step up ring 402 allows interconnection balls 114-1 to have minimum size and pitch. This may be important, for example, when a large number of interconnection balls 114-1 must be provided in a limited area.

In one embodiment, a plurality of image sensor packages 100 are fabricated simultaneously to minimize the cost associated with each individual image sensor package 100. In accordance with this embodiment, image sensors 104 are attached to an array type substrate 602 (FIG. 6) which includes a plurality of individual substrates 102 integrally connected together. Beads 116 (FIG. 7) are formed around the peripheries of image sensors 104. Array type substrate 602 is then singulated, either before (FIG. 7) or after (FIG. 8) array type substrate is populated with interconnection balls 114.

By forming a plurality of image sensor packages 100 simultaneously, several advantages are realized. One advantage is that it is less labor intensive to handle and process a plurality of image sensor packages 100 simultaneously rather than to handle and process each image sensor package 100 on an individual basis. By reducing labor, the cost associated with each package is minimized.

Figure 2:
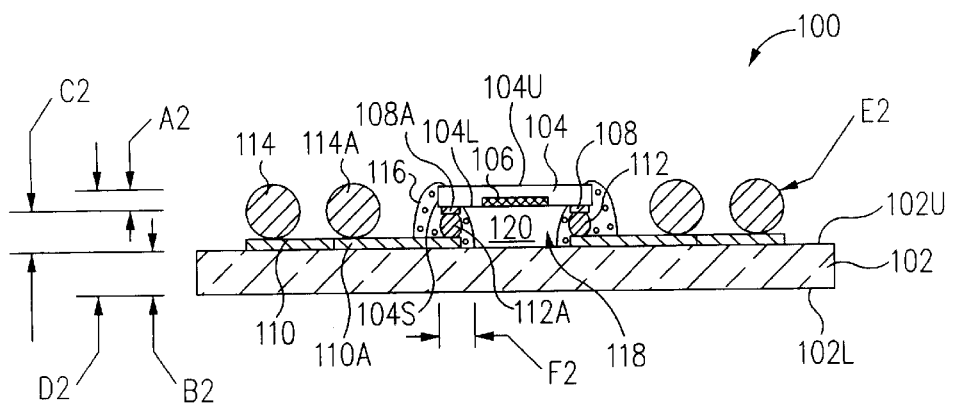
FIG. 2 is a cross-sectional view of the package along the line A—A of FIG. 1 in accordance with one embodiment of the present invention.

More particularly, FIG. 1 is a top plan view of an image sensor package 100 (hereinafter package 100) in accordance with the present invention. FIG. 2 is a cross-sectional view of package 100 along the line A—A of FIG. 1 in accordance with one embodiment of the present invention.

Referring to FIGS. 1 and 2 together, package 100 includes a substrate 102 and an image sensor 104 mounted to substrate 102. Image sensor 104 includes an active area 106 on a lower, e.g., first, surface 104L of image sensor 104 which faces towards substrate 102. Generally, active area 106 is responsive to radiation, e.g., electromagnetic radiation, as is well known to those of skill in the art. For example, active area 106 is responsive to infrared radiation, ultraviolet light, and/or visible light. Illustratively, image sensor 104 is a CMOS image sensor device, a charge coupled device (CCD), or a pyroelectric ceramic on CMOS device although other image sensors are used in other embodiments.

Generally, substrate 102 is transparent to the radiation of interest, e.g., to the radiation to which active area 106 of image sensor 104 is responsive, as those of skill in the art will understand. Generally, the transmittance of substrate 102 is sufficient to allow the necessary minimum amount of radiation needed for the proper operation of image sensor 104 to pass through substrate 102. In one particular embodiment, substrate 102 has a transmittance of approximate 92 percent for electromagnetic radiation having a wavelength in the range of 500 nm to 2200 nm. During use, radiation passes through substrate 102, through medium 120 and strikes active area 106.

In this embodiment, substrate 102 is integral, i.e., is a single piece and not a plurality of pieces connected together. For example, substrate 102 is optical glass, germanium or silicon but can be formed of other materials depending upon the application. In one particular example, substrate 102 is fusion formed 1737 glass composition, designated as 1737 F, supplied by Corning Inc. of Corning, New York. For a detailed description see: (1) "material information" sheet for "code: 1737" F issued January 1996, 5 pages total; (2) "product information" sheet for "display grade products", revised July 1995, 4 pages total; and (3) "product information" sheet for "industrial grade products", revised March 1997, 2 pages total, which are all by Corning Inc., Advanced Display Products, Corning, New York, 14831, which are all herein incorporated by reference in their entireties.

In one embodiment, substrate 102 includes one or more coatings on a lower, e.g., first, surface 102L of substrate 102. This coating(s) can act as a filter such as an infrared filter, or can be and anti-reflection coating, although in other embodiments, substrate 102 does not include a coating. Substrate 102 is typically planar and has no optical power, although in one embodiment, substrate 102 has optical power, e.g., is a lens. Illustratively, substrate 102 is square and dimension A1 (FIG. 1) is 152.0 mm, 101.6 mm, 50.8 mm or 11.67 mm.

Image sensor 104 further includes a plurality of bond pads 108 on lower surface 104L of image sensor 104. Bond pads 108 are connected to the internal circuitry of image sensor 104.

Formed on an upper, e.g., second, surface 102U opposite lower surface 102L of substrate 102 are a plurality of electrically conductive traces 110 which include a first trace 110A. Substrate 102 is an electrical insulator or includes an electrically insulating layer on upper surface 102U. Generally, traces 110 have excellent adhesion to substrate 102 and do not react with, corrode, or otherwise degrade substrate 102. Traces 110 are formed using conventional techniques such as through evaporation, screening and/or plating of an electrically conductive material on substrate 102. Generally, a conductive layer is deposited and patterned or a conductive layer is selectively deposited.

In one embodiment, traces 110 include evaporated aluminum, gold, indium, palladium, nickel, platinum, tungsten and/or silver and/or a combination thereof. In another embodiment, traces 110 are a thick film metallization which includes gold, gold plated indium, nickel plated indium, gold plated nickel plated indium, platinum silver, palladium silver, indium, gold plated nickel plated tungsten, silver and/or tungsten and/or a combination thereof. However, in light of this disclosure, those of skill in the art will understand that traces 110 can be formed of other materials and/or using other techniques.

Bond pads 108 are electrically connected to corresponding traces 110 by electrically conductive bumps 112. In one embodiment, bond pads 108 are aluminum and, optionally, plated gold on the aluminum, and electrically conductive bumps 112 are: (1) stud bumps, i.e., gold balls; (2) electrically conductive epoxy paste; or (3) electrically conductive epoxy film as are well known to those of skill in the art. In an alternative embodiment, bond pads 108 are gold on nickel on tungsten or gold on nickel on chrome and are electrically connected to traces 110 using a conventional flip chip process, e.g., with solder. In another embodiment, bond pads 108 are: (1) aluminum; (2) plated nickel vanadium on the aluminum; (3) plated copper on the nickel vanadium; and (4) optionally, plated solder on the copper and electrically conductive bumps 112 are solder. In yet another embodiment, bond pads 108 are: (1) aluminum; (2) plated titanium tungsten on the aluminum; (3) plated copper on the titanium tungsten; and (4) optionally, plated solder on the copper and electrically conductive bumps 112 are solder.

Formed on and electrically connected to traces 110 are corresponding electrically conductive interconnection balls 114 such solder balls. Interconnection balls 114 are used to electrically connect package 100 to a larger substrate (not shown) such as a printed circuit mother board.

To illustrate, a first bond pad 108A of the plurality of bond pads 108 of image sensor 104 is electrically connected to first trace 110A of the plurality of traces 110 by a first bump 112A of the plurality of bumps 112. First trace 110A is electrically connected to a first interconnection ball 114A of the plurality of interconnection balls 114.

As set forth above, an electrically conductive pathway between bond pad 108A and interconnection ball 114A is formed by bump 112A and trace 110A. The other bond pads 108, traces 110, bumps 112, and interconnection balls 114 are electrically connected to one another in a similar fashion so are not discussed further to avoid detracting from the principals of the invention.

Although a particular electrically conductive pathway between bond pad 108A and interconnection ball 114A is described above, in light of this disclosure, it is understood that other electrically conductive pathways can be formed. For example, instead of direct electrical connections between bond pads 108 and bumps 112, between bumps 112 and traces 110, and between traces 110 and interconnection balls 114, contact metallizations are interposed between the items.

Further, it is understood that the number of bond pads 108, bumps 112, traces 110, and interconnection balls 114 used depends upon the particular input/output requirements of image sensor 104. In addition, interconnection balls 114 are distributed in a variety of formats, e.g., in an array format to form a ball grid array package.

A bead 116 contacts the periphery of image sensor 104 and secures the periphery of image sensor 104 to substrate 102. Generally, bead 116 contacts sides 104S of image sensor 104 and upper surface 102U of substrate 102. Typically, bead 116 is an electrical insulator. In one embodiment, bead 116 extends slightly under image sensor 104 and contacts the periphery of lower surface 104L, for example, extends inwards from sides 104S by 0.15±0.05 mm (i.e., dimension F2 of FIG. 2 is 0.15±0.05 mm). In other embodiments, bead 116 extends over image sensor 104 and contacts the periphery of an upper, e.g., second surface 104U opposite lower surface 104L of image sensor 104 or, alternatively, entirely contacts upper surface 104U.

To the extent that image sensor 104 has a different thermal coefficient of expansion than substrate 102, bead 116 insures that image sensor 104 does not become dismounted from substrate 102 as a result of differential thermal expansion between image sensor 104 and substrate 102.

Further, bead 116 forms a seal between the periphery of image sensor 104 and substrate 102. Thus, image sensor 104, bead 116, and substrate 102 define a cavity 118 which is sealed. In particular, active area 106 is located within cavity 118 which is sealed to protect active area 106 against external moisture, dust and contamination. In one embodiment, bead 116 is an epoxy dispense material such as Hysol 4323.

Generally, cavity 118 contains a medium 120 which is transparent to the radiation of interest, e.g., to the radiation to which active area 106 of image sensor 104 is responsive. For example, if the radiation of interest is visible light, medium 120 should have a low refractive index so that medium 120 will not reduce the effectiveness of detector cells such as color or μ-lens fitted detector cells within active area 106. Further, medium 120 should be free from physical defects which may cause point defects in a received spatial light pattern. In one embodiment, medium 120 is air.

To use package 100, package 100 is mounted to a larger substrate such as a printed circuit mother board. Package 100 is mounted using conventional techniques such as by re-flowing interconnection balls 114. Once mounted, lower surface 102L of substrate 102 faces away from the larger substrate and is exposed.

Radiation is directed at and strikes lower surface 102L of substrate 102. This radiation passes through substrate 102, through medium 120 and strikes active area 106. Image sensor 104 responds to this radiation as is well known to those of skill in the art.

Of importance, substrate 102 serves a dual function. In particular, substrate 102 is the window which covers active area 106 of image sensor 104. Further, substrate 102 is the platform upon which package 100 is fabricated.

Recall that in the prior art, a housing was used to support the window above the image sensor. These housings were typically formed of ceramic which was relatively expensive. Advantageously, package 100 in accordance with the present invention eliminates the need for a housing of the prior art. Accordingly, package 100 is significantly less expensive to manufacture than image sensor assemblies of the prior art.

Further, active area 106 of image sensor 104 is hermetically sealed in cavity 118, and in particular, is hermetically sealed by the combination of image sensor 104, bead 116, and substrate 102. Hermetically sealing active area 106 in accordance with the present invention reduces complexity and cost in the event image sensor 104 must be repaired or replaced compared to the prior art.

Recall that in the prior art, the housing which hermetically sealed the image sensor was mounted directly to the larger substrate. Thus, removal of the housing necessarily exposed the image sensor to the ambient environment and to dust. For this reason, the image sensor had to be repaired or replaced in a cleanroom or else there was a risk of damaging or destroying the image sensor.

In contrast, active area 106 is hermetically sealed as part of package 100. Package 100 is mounted to the larger substrate, for example, by reflowing interconnection balls 114. To repair or replace image sensor 104, package 100 is simply removed and a new package 100 is mounted to the larger substrate. At no time is active area 106 exposed to the ambient environment during this procedure. Advantageously, this procedure can be performed in any facility with or without a cleanroom. The old package 100 is discarded or shipped to a central facility for repair. Since package 100 is simple to manufacture and service, the cost associated with package 100 are minimized compared to the prior art.

Further, package 100 is relatively thin compared to prior art image sensor assemblies. In particular, by mounting image sensor 104 directly to substrate 102 which also serves as the window for image sensor 104, the resulting thickness of package 100 is relatively small, e.g., is 0.99 mm. Recall that in the prior art, the image sensor was mounted directly to the larger substrate and a housing was used to support a window above the image sensor. This housing extended a significant distance, e.g., 0.100 inches (2.54 mm) to 0.120 inches (3.05 mm) or more, from the larger substrate. Since package 100 in accordance to the present invention is relatively thin compared to an image sensor assembly of the prior art, package 100 is well suited for use with miniature lightweight electronic devices which require thin and lightweight image sensor assemblies.

Illustrative specifications for the various characteristics illustrated in FIG. 2 are set forth below in Table 1.

TABLE 1

| Characteristic | Description | Specification |
| --- | --- | --- |
| A2 | image sensor thickness | 0.66 ± 0.10 mm, e.g., 0.71 mm |
| B2 | substrate thickness | 0.41 to 0.66 mm, e.g., 0.61 mm |

TABLE 1-continued

| Characteristic | Description | Specification |
| --- | --- | --- |
| C2 | bump thickness | 0.08 to 0.13 mm, e.g., 0.10 mm |
| D2 | overall thickness of mounted image sensor and substrate | 1.05 to 1.55 mm, e.g., 1.42 mm |
| E2 | ball size and pitch | 1.01 mm dia on 1.50 mm center |

To further reduce the thickness of package 100, in one embodiment, image sensor 104 is back lapped, i.e., upper surface 104U is ground down typically while image sensor 104 is still in wafer form so that upper surface 104U is a grinded surface. By reducing of the thickness of image sensor 104, the minimum allowable size of interconnection balls 114 is also reduced.

Generally, interconnection balls 114 must be of a sufficient size to achieve a required system level clearance between the larger substrate and upper surface 104U of image sensor 104 after package 100 is mounted to the larger substrate. In particular, interconnection balls 114 extend above upper surface 102U of substrate 102 to a greater height than the height of upper surface 104U of image sensor 104 above upper surface 102U of substrate 102.

Illustrative specifications for the various characteristics illustrated in FIG. 2 for a package 100 having a back lapped image sensor 104 are set forth below in Table 2.

TABLE 2

| Characteristic | Description | Specification |
| --- | --- | --- |
| A2 | image sensor thickness | 0.28 mm |
| B2 | substrate thickness | 0.41 to 0.66 mm e.g., 0.61 mm |
| C2 | bump thickness | 0.08 to 0.13 mm e.g., 0.10 mm |
| D2 | overall thickness of mounted image sensor and substrate | 0.77 to 1.07 mm, e.g., 0.99 mm |
| E2 | ball size and pitch | 0.76 mm dia on 1.27 mm center |

Figure 3:
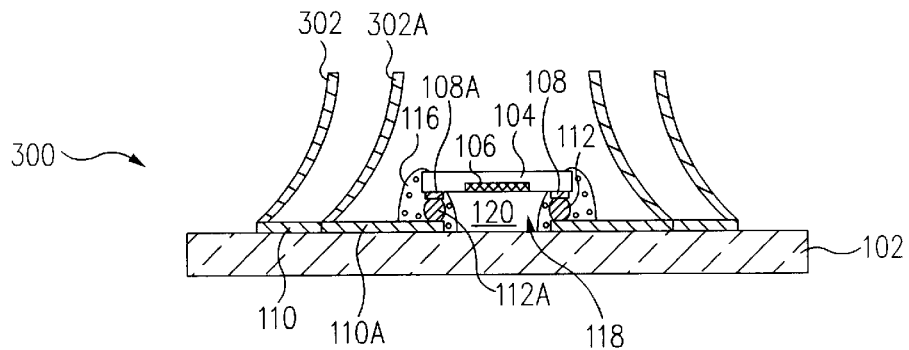
FIG. 3 is a cross-sectional view of an image sensor package in accordance with an alternative embodiment of the present invention.

In an alternative embodiment, instead of having interconnection balls 114, flexible conductors are used. FIG. 3 is a cross-sectional view of image sensor package 300 in accordance with this embodiment of the present invention.

As shown in FIG. 3, flexible conductors 302 are electrically connected to corresponding traces 110. To illustrate, a first flexible conductors 302A of the plurality of flexible conductors 302 is electrically connected to trace 110A. The other flexible conductors 302 are electrically connected to the other corresponding traces 110 in a similar manner. Flexible conductors 302 are electrically connected to corresponding traces 110 using solder reflow, electrically conductive adhesive, and/or another suitable technique.

Flexible conductors 302 provide greater freedom in the location of package 300 with respect to the larger substrate. Further, in the event image sensor 104 is relatively thick and would otherwise require relatively large interconnection balls 114 (interconnection balls 114 are illustrated in FIGS. 1 and 2), flexible conductors 302 are well suited for use.

In yet another alternative embodiment, a step up ring is used to elevate interconnection balls above image sensor 104 as discussed further below in reference to FIG. 4. Elevating interconnection balls, and more generally an interconnection structure, is important when image sensor 104 is relatively thick, e.g., is greater than 0.014 inches (0.356 mm), and would otherwise require relatively large interconnection balls 114.

Figure 4:
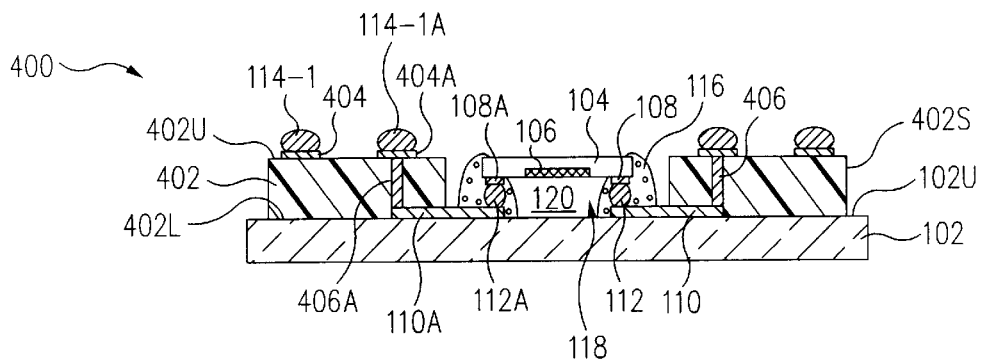
FIG. 4 is a cross-sectional view of an image sensor package along the line A—A of FIG. 1 in accordance with another alternative embodiment of the present invention.

FIG. 4 is a cross-sectional view of an image sensor package 400 along the line A—A of FIG. 1 in accordance with an alternative embodiment of the present invention. As shown in FIG. 1 (in dashed lines) and in FIG. 4, a step up ring 402 surrounds image sensor 104. Step up ring 402 is ceramic, printed circuit board material, or electrically insulative tape although other electrically insulative materials can be used. A lower, e.g., first, surface 402L of step up ring 402 is attached to upper surface 102U of substrate 102. Traces 110 extend under step up ring 402. Traces 110 are electrically connected to electrically conductive lands 404 on an upper, e.g., second, surface 402U of step up ring 402 by electrically conductive vias 406. Vias 406 extend from lower surface 402L to upper surface 402U of step up ring 402. Interconnection balls 114-1 are formed on lands 404.

To illustrate, trace 110A is electrically connected to a first via 406A of the plurality of vias 406. First via 406A is electrically connected to a first land 404A of the plurality of lands 404. A first interconnection ball 114-1A of the plurality of interconnection balls 114-1 is formed on and electrically connected to first land 404A. The other traces 110, vias 406, lands 404, and interconnection balls 114-1 are electrically connected in a similar fashion so are not discussed further.

Advantageously, use of step up ring 402 allows interconnection balls 114-1 to have minimum size and pitch. This may be important, for example, when a large number of interconnection balls must be provided in a limited area.

Although a particular electrically conductive pathway between bond pads 108 and interconnection balls 114-1 is set forth, in light of this disclosure, those of skill in the art will recognize that other electrically conductive pathways can be formed. For example, step up ring 402 is a multi-layered laminated structure and, instead of straight through vias 406, a plurality of the electrically conductive traces on various layers in step up ring 402 are interconnected by a plurality of electrically conductive vias to form the electrical interconnections between traces 110 and lands 404. As another example, interconnection balls 114-1 are distributed in an array format to form a ball grid array type package. Alternatively, interconnection balls 114-1 are not formed resulting in a metal land array type package. As a further alternative, flexible conductors similar to flexible conductors 302 of FIG. 3 are used instead of interconnection balls 114-1.

Figure 5:
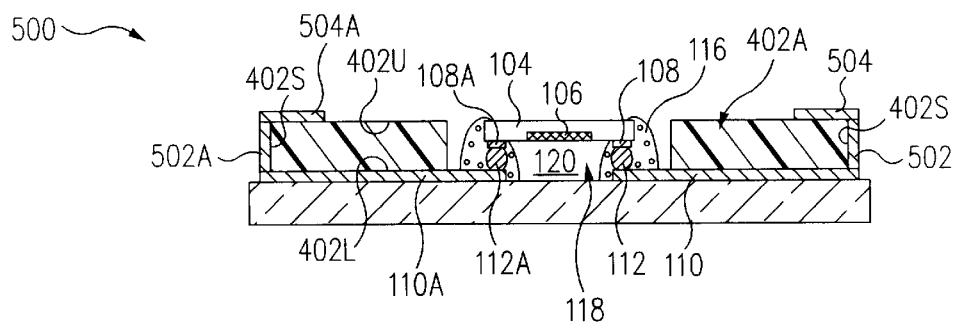
FIG. 5 is a cross-sectional view of an image sensor package in accordance with yet another alternative embodiment.

In another embodiment, instead of vias 406, electrically conductive traces are formed along outer sides 402S of step up ring 402 which extend between lower surface 402L and upper surface 402U of step up ring 402. FIG. 5 is a cross-sectional view of an image sensor package 500 in accordance with this alternative embodiment.

Referring to FIG. 5, traces 110 extend to outer sides 402S of a step up ring 402A. Outer traces 502 extend along outer sides 402S from lower surface 402L to upper surface 402U of step up ring 402A. Outer traces 502 are electrically connected to electrically conductive pads 504, sometimes called lands, on upper surface 402U of step up ring 402A. Pads 504 are typically arrange directly adjacent sides 402S to form a leadless chip carrier (LCC) style footprint.

To illustrate, first trace 110A is electrically connected to a first outer trace 502A of the plurality of outer traces 502. First outer trace 502A is electrically connected to a first pad 504A of the plurality of pads 504. The other traces 110, outer traces 502, and pads 504 are similarly connected so are not discussed further.

Figure 6:
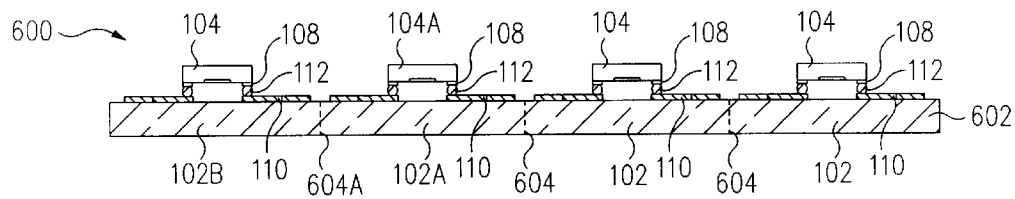
FIG. 6 is a cross-sectional view of an array of image sensor packages during assembly in accordance with the present invention.

Referring again to FIGS. 1 and 2, in one embodiment, package 100 is fabricated simultaneously with a plurality of packages 100 to minimize the cost associated with each individual package 100. FIG. 6 is a cross-sectional view of an array 600 of image sensor packages 100 during assembly in accordance with this embodiment of the present invention.

Referring to FIG. 6, array 600 includes a substrate 602. Substrate 602 includes a plurality of individual substrates 102 integrally connected together in an array format. For example, substrate 602 includes a 4×4 array of substrates 102 integrally connected together for a total of sixteen substrates 102, although it is understood that other array formats and number of substrates 102 can be used.

Each of substrates 102 is delineated by a singulation street 604 which is located between adjacent substrates 102. For example, a first singulation street 604A of the plurality of singulation streets 604 separates a first substrate 102A of the plurality of substrates 102 from a second substrate 102 B of the plurality of substrates 102. The other substrates 102 are similarly separated from adjacent substrates 102 by corresponding singulation streets 604.

As shown in FIG. 6, image sensors 104 are attached to substrate 602. For example, a first image sensor 104A of the plurality of image sensors 104 is attached to first substrate 102A. The other image sensors 104 are attached to corresponding substrates 102 a similar manner.

Preferably, image sensors 104 are ground down, sometimes called back lapped, to minimize the thickness of image sensors 104 before image sensors 104 are attached to substrate 602.

Each image sensor 104 is aligned with substrate 602 using any one of a number of conventional alignment techniques, e.g., image sensors 104 are optically or mechanically aligned, and attached to substrate 602. Image sensors 104 are attached to substrate 602 using any one of a number of techniques. For example, solder bumps 112 are formed on bond pads 108 of image sensors 104 or alternatively, on traces 110, and solder bumps 112 are reflowed to attach bond pads 108 to traces 110. Alternatively, bond pads 108 of image sensors 104 are attached to traces 110 by bumps 112 formed of electrically conductive epoxy paste or film which is thermally or optically cured. As a further alternative, bond pads 108 of image sensors 104 are attached to traces 110 by thermal or thermosonic bonding of gold bumps 112 formed on bond pads 108, or alternatively, on traces 110. In light of this disclosure, those of skill in the art will understand that other methods of attaching image sensors 104 to substrate 602 can be used.

Figure 7:
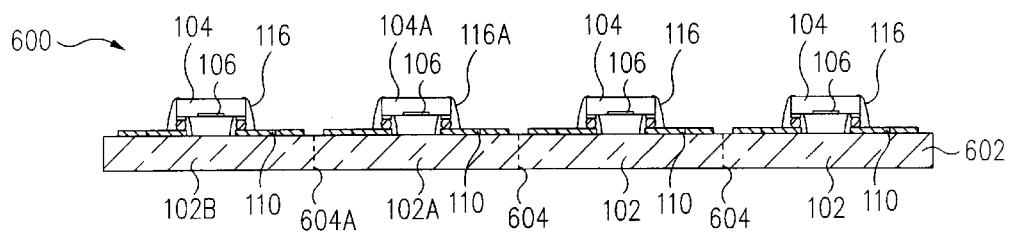
FIG. 7 is a cross-sectional view of the array of FIG. 6 at a later stage of assembly.

FIG. 7 is a cross-sectional view of array 600 of FIG. 6 at a later stage of assembly in accordance with this embodiment of the present invention. As shown in FIG. 7, beads 116 are formed around the peripheries of image sensors 104. To illustrate, a first bead 116A of the plurality of beads 116 is formed around a periphery of first image sensor 104A. The other beads 116 are similarly formed around the peripheries of the other image sensors 104.

Of importance, beads 116 are formed in a manner which prevents beads 116 from completely filling the spaces between image sensors 104 and substrate 602. More particularly, beads 116 do not contact active areas 106 of image sensors 104.

Generally, beads 116 are formed from a limited flow material. For example, an epoxy dispense material such as Hysol 4323 is applied using a needle dispenser and then cured to form beads 116.

Figure 8:
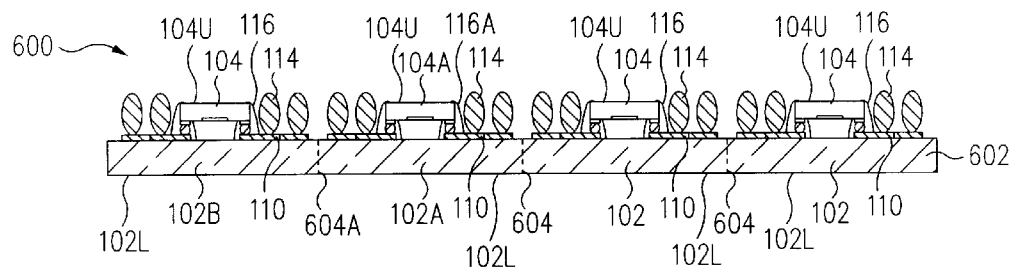
FIG. 8 is a cross-sectional view of the array of FIG. 7 at a later stage of assembly.

FIG. 8 is a cross-sectional view of array 600 of FIG. 7 at a later stage of assembly in accordance with this embodiment of the present invention. As shown in FIG. 8, substrate 602 is populated with interconnection balls 114 on corresponding traces 110.

In one embodiment, each package 100 is marked to identify the part number associated with image sensor package 100. For example, upper surfaces 104U of image sensors 104 or noncritical, e.g., peripheral, areas of lower surfaces 102U of substrates 102 are marked by laser or ink.

It alternative embodiments, instead of forming interconnection balls 114 on corresponding traces 110 as shown in FIG. 8: (1) flexible conductors such as flexible conductors 302 of FIG. 3 are attached to traces 110; (2) step up rings similar to step up ring 402 of FIG. 4 are attached to each substrate 102 and, in one embodiment, populated with interconnection balls similar to interconnection balls 114-1 of FIG. 4; or (3) step up ring similar to step up ring 402A of FIG. 5 are attached to each substrate 102.

Referring still to FIG. 8, array 600 is singulated into a plurality of individual image sensor packages 100 (FIGS. 1, 2 ) by singulating substrate 602 along singulation streets 604. Singulation can be accomplished using any one of a number of conventional singulation techniques, e.g., by laser cutting or mechanical sawing through substrate 602 along singulation streets 604. Array 600 can also be singulated before interconnection balls 114 are populated, e.g., after the assembly shown in FIG. 7 is completed.

By forming a plurality of packages 100 simultaneously, several advantages are realized. One advantage is that it is less labor intensive to handle and process a plurality of packages 100 simultaneously rather than to handle and process each package 100 on an individual basis. By reducing labor, the cost associated with each package 100 is minimized. However, in light of this disclosure, those of skill in the art will recognize that packages 100 can also be manufactured on an individual basis if desired.

This application is related to Glenn et al., co-filed and commonly assigned U.S. patent application Ser. No. 09/447, 202, entitled "THIN IMAGE SENSOR PACKAGE", which is herein incorporated by reference in its entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

We claim:

1. A method comprising:

forming a trace on a substrate;

attaching a bond pad of an image sensor to said trace; and directing radiation at said substrate, wherein said radiation passes through said substrate and strikes an active area of said image sensor.

2. The method of claim 1 further comprising:

forming a bead around a periphery of said image sensor, wherein said image sensor, said bead, and said substrate defined a cavity, said active area being within said cavity.

3. The method of claim 2 wherein said cavity is filled with a medium transparent to said radiation.

4. The method of claim 3 wherein said medium is air.

5. A method comprising:

forming a trace on a substrate;

attaching a bond pad of an image sensor to said trace;

forming a bead around a periphery of said image sensor, wherein said image sensor, said bead, and said substrate defined a cavity, an active area of said image sensor being located within said cavity.

6. The method of claim 5 wherein said substrate is one of a plurality of substrates integrally connected together in an array.

7. The method of claim 6 further comprising singulating said array.

8. The method of claim 5 further comprising back lapping said image sensor to reduce a thickness of said image sensor.

9. The method of claim 5 wherein said bond pad is attached to said trace by an electrically conductive bump.

10. The method of claim 5 further comprising forming an interconnection ball on said trace.

11. The method of claim 5 further comprising attaching a flexible conductor to said trace.

12. The method of claim 5 further comprising attaching a step up ring to said substrate.

13. The method of claim 12 wherein a first surface of said step up ring is attached to said substrate, said trace being electrically connected to an electrically conductive land on a second surface of said step up ring.

14. The method of claim 13 wherein an electrically conductive via extends from said first surface to said second surface of said step up ring, said via electrically connecting said trace to said land.

15. The method of claim 13 further comprising forming an electrically conductive interconnection ball on said land.

16. The method of claim 13 wherein said step up ring has an outer side which extends between said first surface and said second surface of said step up ring, said trace being electrically connected to said land by an outer trace extending along said outer side of said step up ring.

* * * * *